(12) United States Patent
Chang et al.

(10) Patent No.: US 9,417,292 B1
(45) Date of Patent: Aug. 16, 2016

(54) THERMOMAGNETIC TEMPERATURE SENSING

(75) Inventors: Chia-Ming Chang, Agoura Hills, CA (US); John Wang, Glendora, CA (US); Geoffrey P. McKnight, Los Angeles, CA (US); Ping Liu, Irvine, CA (US)

(73) Assignee: HRL Laboratories, LLC, Malibu, CA (US)

( * ) Notice: Subject to any disclaimer, the term of this patent is extended or adjusted under 35 U.S.C. 154(b) by 684 days.

(21) Appl. No.: 13/490,411

(22) Filed: Jun. 6, 2012

Related U.S. Application Data

(60) Provisional application No. 61/494,849, filed on Jun. 8, 2011.

(51) Int. Cl.
*G01K 7/36* (2006.01)
*G01R 33/00* (2006.01)

(52) U.S. Cl.
CPC . *G01R 33/00* (2013.01); *G01K 7/36* (2013.01)

(58) Field of Classification Search
CPC ........ G01R 33/09; G01R 33/16; G01R 33/18; G01R 33/00; F16N 2250/08; F16N 2250/32; G01K 7/36
USPC ............. 374/163, 176, 141, 120; 340/870.17; 702/38, 63, 130; 324/244, 200
See application file for complete search history.

(56) References Cited

U.S. PATENT DOCUMENTS

| | | | |
|---|---|---|---|
| 1,697,148 A | 1/1929 | Spooner | |
| 2,350,329 A | 6/1944 | Hornfeck | |
| 2,480,433 A | 8/1949 | Amsler | |
| 2,637,823 A | 5/1953 | Anderson et al. | |

(Continued)

FOREIGN PATENT DOCUMENTS

| JP | 61133828 A | | 6/1986 |
|---|---|---|---|
| SU | 1113684 A | * | 9/1984 |

(Continued)

OTHER PUBLICATIONS

Bozorth, R. M., "Ferromagnetism," D. Van Nostrand Company, 1951, pp. 720-723.

(Continued)

*Primary Examiner* — Gail Kaplan Verbitsky
(74) *Attorney, Agent, or Firm* — North Shore Associates

(57) ABSTRACT

A thermomagnetic sensor includes a thermomagnetic probe that includes a ferromagnetic material having a temperature-dependent magnetic permeability characterized by a maximum magnetic permeability value at a temperature below a Curie temperature of the ferromagnetic material. The thermomagnetic sensor further includes an alternating magnetic field source to produce an alternating magnetic field in a vicinity of the thermomagnetic probe to facilitate a measurement of the temperature-dependent magnetic permeability as function of temperature remotely using a thermomagnetic effect. A predetermined relationship between the temperature-dependent magnetic permeability and temperature in a range between the maximum magnetic permeability value and the Curie temperature provides a measurement of a temperature local to the thermomagnetic probe. A battery-temperature measurement system includes the thermomagnetic probe in a battery, a magnetic field coil to apply the alternating magnetic field, and a magnetic permeability measurement apparatus to measure the temperature-dependent magnetic permeability.

16 Claims, 5 Drawing Sheets

(56) References Cited

U.S. PATENT DOCUMENTS

| | | | |
|---|---|---|---|
| 2,756,595 A | | 7/1956 | Rathenau et al. |
| 3,164,993 A | | 1/1965 | Schmidt |
| 3,413,540 A | | 11/1968 | Vansant |
| 3,421,374 A | | 1/1969 | Wieting et al. |
| 3,836,827 A | * | 9/1974 | Cuthbertson ........ H01H 37/585 335/208 |
| 3,848,466 A | * | 11/1974 | Dial ........................ G01K 13/02 324/224 |
| 4,092,586 A | * | 5/1978 | Dinkler et al. ................. 324/419 |
| 4,256,945 A | | 3/1981 | Carter et al. |
| 4,371,272 A | | 2/1983 | Iwasaki |
| 5,062,062 A | | 10/1991 | Nishibe et al. |
| 5,087,804 A | * | 2/1992 | McGaffigan .................. 219/618 |
| 5,103,174 A | | 4/1992 | Wandass et al. |
| 5,255,981 A | | 10/1993 | Schiessle et al. |
| 5,722,317 A | * | 3/1998 | Ghiron et al. ..................... 99/452 |
| 5,766,793 A | | 6/1998 | Kameishi et al. |
| 5,775,810 A | | 7/1998 | Shin |
| 5,898,356 A | | 4/1999 | Gascoyne et al. |
| 6,208,253 B1 | * | 3/2001 | Fletcher et al. ................ 340/584 |
| 6,210,824 B1 | | 4/2001 | Sullivan et al. |
| 6,904,378 B2 | | 6/2005 | Schilling et al. |
| 7,213,967 B2 | * | 5/2007 | Simunovic et al. ............ 374/102 |
| 7,537,384 B2 | | 5/2009 | Hilgers |
| 7,595,128 B2 | | 9/2009 | Lee et al. |
| 7,794,142 B2 | | 9/2010 | Clothier et al. |
| 7,931,400 B2 | * | 4/2011 | Hasegawa et al. .............. 374/176 |
| 8,519,666 B2 | * | 8/2013 | Terao et al. .................... 320/108 |
| 2003/0052696 A1 | * | 3/2003 | Strayer et al. .................. 324/546 |
| 2003/0081649 A1 | | 5/2003 | Strayer et al. |
| 2006/0023768 A1 | | 2/2006 | Ishihara et al. |
| 2006/0152313 A1 | * | 7/2006 | Zmood .......................... 335/208 |
| 2008/0212646 A1 | | 9/2008 | Azuma et al. |
| 2009/0257470 A1 | | 10/2009 | Giors et al. |
| 2010/0006562 A1 | | 1/2010 | Clothier |
| 2010/0080263 A1 | * | 4/2010 | Gonzales et al. ............. 374/176 |
| 2010/0276501 A1 | | 11/2010 | Yoshimura et al. |
| 2010/0322283 A1 | * | 12/2010 | Clothier et al. ............... 374/176 |
| 2011/0090937 A1 | | 4/2011 | Malyshev et al. |
| 2013/0315281 A1 | | 11/2013 | Malyshev et al. |

FOREIGN PATENT DOCUMENTS

| | | |
|---|---|---|
| SU | 1134745 A | 1/1985 |
| WO | 2011106825 A2 | 9/2011 |

OTHER PUBLICATIONS

Brito, V. L. O. et al., "Evaluation of a Ni—Zn Ferrite for Use in Temperature Sensors," Progress in Electromagnetics Research Letters, vol. 13, 2010, pp. 103-112.

Mavrudieva, D. et al., "Magnetic structures for contactless temperature sensor," Sensors and Actuators A, vol. 142 (2008), pp. 464-467.

Kim, Y. H. et al., "Remote Temperature Sensing System Using Reverberated Magnetic Flux," IEEE Transactions on Magnetics, vol. 36, No. 5, Sep. 2000, pp. 3643-3645.

Naoe, M et al., "Basic investigation of microtemperature sensor by means of a novel transmission-line technique using a temperature-sensitive Li—Zn—Cu ferrite substrate," Journal of Magnetism and Magnetic Materials, vol. 320 (2008), pp. e949-e953.

Weaver, J. B. et al., "Magnetic nanoparticle temperature estimation," Med. Phys., vol. 35, No. 5, May 2009, pp. 1822-1829.

USPTO Office Action with Notification Date of Jun. 15, 2016 which includes PTO-892 (total pages 11) for co-pending, unpublished U.S. Appl. No. 14/194,724.

* cited by examiner

THERMOMAGNETIC TEMPERATURE SENSING

CROSS-REFERENCE TO RELATED APPLICATIONS

This application claims priority from U.S. Provisional Patent Application, Ser. No. 61/494,849, filed Jun. 8, 2011, the entire contents of which is incorporated herein by reference.

STATEMENT REGARDING FEDERALLY SPONSORED RESEARCH OR DEVELOPMENT

N/A

BACKGROUND

1. Technical Field

The invention relates to systems and methods of measuring and testing. In particular, the invention relates to temperature sensors and measuring with temperature sensors.

2. Description of Related Art

Temperature is often an important parameter to measure or monitor. In particular, temperature is often monitored to one or more of control an operational characteristic, improve efficiency and assure the safe operation of a device or system. For example, temperature may be measured to determine if a device is operating within a range that is deemed acceptable. If the temperature is determined to be either outside of the acceptable temperature range or exhibiting abnormal fluctuations, steps can be taken to adjust the temperature, for example by initiating either cooling or heating of the device. Alternatively, an operational characteristic of the device (e.g., power consumption) may be altered to maintain an acceptable operating temperature of the device. In other examples, temperature may be monitored to characterize an operational state or condition of the device or system. For example, a system may undergo an increase in temperature that, when a predetermined temperature is reached, indicates that the system has reached a goal state or condition. Monitoring or measuring the system temperature may be used to determine whether the goal has been achieved, and further may provide feedback to a controller that progress is being made by the system towards the goal.

Unfortunately, measuring temperature of a device or system may present certain challenges in many practical situations. For example, it may be useful to directly measure a temperature internal to a device instead of a surface temperature of the device. The internal temperature may be more meaningful than the surface temperature for various monitoring situations, for example. However, monitoring an internal temperature may present various practical difficulties, especially when it is difficult or even impossible to run wires into the device or system. For example, the device may be housed in a sealed container. Passing wires associated with a conventional temperature sensor (e.g., a thermal couple) through the container to measure the internal temperature may not be possible or practical in certain situations. In other examples, such as temperature distribution mapping within a device, providing sensor leads to and from multiple temperature sensors at numerous points within the device may be impractical, may interfere with the mapping itself and even may be detrimental to device operation.

BRIEF SUMMARY

In some embodiments in accordance with the principles of the present invention, a thermomagnetic sensor is provided. The thermomagnetic sensor comprises a thermomagnetic probe comprising a ferromagnetic material having a temperature-dependent magnetic permeability characterized by a maximum magnetic permeability value below a Curie temperature of the ferromagnetic material. The temperature-dependent magnetic permeability monotonically decreases as a function of temperature between the maximum value and the Curie temperature. The thermomagnetic sensor further comprises an alternating magnetic field source to produce an alternating magnetic field in a vicinity of the thermomagnetic probe to facilitate a measurement of the temperature-dependent magnetic permeability as function of temperature. The alternating magnetic field has a frequency between about 10 hertz and about 10 kilohertz. A predetermined relationship between the temperature-dependent magnetic permeability and temperature in a range between the maximum value and the Curie temperature provides a measurement of a temperature local to the thermomagnetic probe.

In some embodiments in accordance with the principles of the present invention, a battery-temperature measurement system is provided. The battery-temperature measurement system comprises a thermomagnetic probe in a battery. The thermomagnetic probe comprises a ferromagnetic material having a temperature-dependent magnetic permeability characterized by a maximum magnetic permeability value below a Curie temperature of the ferromagnetic material. The temperature-dependent magnetic permeability has a monotonically decreasing value as a function of temperature between the maximum value and the Curie temperature. The battery-temperature measurement system further comprises a magnetic field coil external to the battery to apply an alternating magnetic field to the thermomagnetic probe, and a magnetic permeability measurement apparatus to measure the temperature-dependent magnetic permeability of the thermomagnetic probe. The measured temperature-dependent magnetic permeability determines a temperature local to the thermomagnetic probe for a temperature range between the maximum magnetic permeability value and the Curie temperature of the ferromagnetic material of the thermomagnetic probe.

In some embodiments in accordance with the principles of the present invention, a method of measuring temperature remotely using a thermomagnetic effect is provided. The method of remotely measuring temperature comprises providing a thermomagnetic probe comprising a ferromagnetic material having a temperature-dependent magnetic permeability characterized by a maximum magnetic permeability value below a Curie temperature of the ferromagnetic material. The ferromagnetic material exhibits a monotonically decreasing temperature-dependent magnetic permeability value as a function of temperature between the maximum value and the Curie temperature. The method of remotely measuring temperature further comprises measuring the temperature-dependent magnetic permeability using an alternating magnetic field having a frequency between about 10 hertz and about 10 kilohertz to determine a temperature local to the thermomagnetic probe. The local temperature is determined according to a predetermined relationship between temperature and the temperature-dependent magnetic permeability in a temperature range between the maximum magnetic permeability value and the Curie temperature.

BRIEF DESCRIPTION OF THE DRAWINGS

Various features of embodiments in accordance with the principles of the present invention described herein may be more readily understood with reference to the following detailed description taken in conjunction with the accompanying drawings, where like reference numerals designate like structural elements, and in which.

Certain embodiments according to the principles of the present invention have other features that are one of in addition to and in lieu of the features illustrated in the above-referenced figures. These and other features are detailed below with reference to the above-referenced figures.

DETAILED DESCRIPTION

Embodiments consistent with the principles of the present invention as described herein provide remote determination or measurement of a temperature of a device or structure. In particular, the temperature of a device or structure may be measured by an effect that the temperature has on a magnetic property of a thermomagnetic probe located within the device or structure. Further, the temperature is sensed or detected remotely using a magnetic field and without direct electrical contact with the thermomagnetic probe, according to various examples. The remote sensing of temperature according to the principles of the present invention as described herein may facilitate measuring temperature internal to a device or structure where it may be difficult or substantially impossible to run wires to perform the measurement using conventional (e.g., wired) temperature sensors, in some examples. Moreover, the remote temperature sensing described below may also provide two-dimensional (2-D), and in some examples, three-dimensional (3-D), mapping of temperature within the device or structure.

Figure 1:
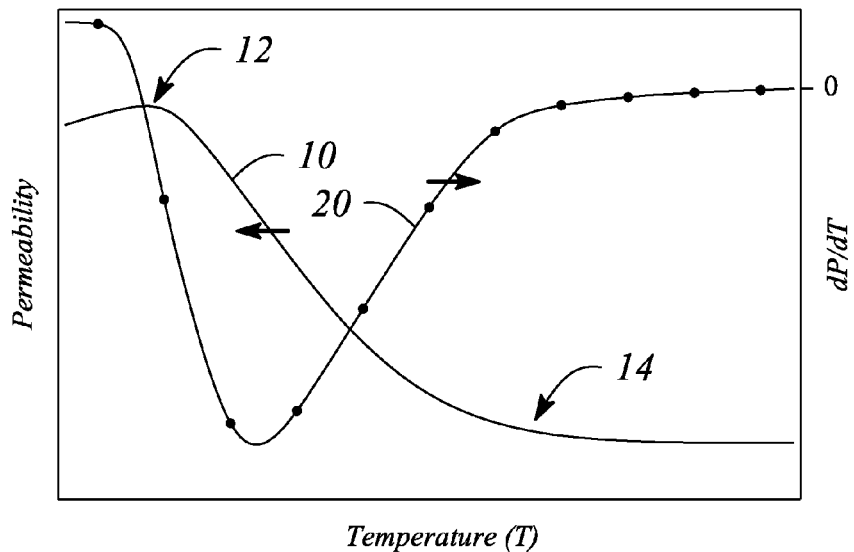
FIG. 1 illustrates a graph of a magnetic property of an example ferromagnetic material as a function of temperature, according to an embodiment consistent with the principles of the present invention.

FIG. 1 illustrates a graph of a magnetic property of an example ferromagnetic material as a function of temperature, according to an embodiment consistent with the principles of the present invention. The variation of the magnetic property of the ferromagnetic material as a function of temperature is often referred to as a 'thermomagnetic effect.' In particular, FIG. 1 illustrates a temperature-dependent variation in magnetic permeability 10 as a function of temperature that is characteristic of ferromagnetic materials used in the thermomagnetic probe, according to various examples. As illustrated, the temperature-dependent magnetic permeability 10 of the ferromagnetic material exhibits a maximum or peak value, known as the Hopkinson peak 12, and a Curie point or Curie temperature 14. The Curie temperature 14 is a temperature at which the example ferromagnetic material undergoes a transition and becomes substantially paramagnetic, by definition herein. As illustrated, the temperature-dependent magnetic permeability 10 decreases monotonically from the maximum value at the Hopkinson peak 12 to an effective paramagnetic magnetic permeability at the Curie temperature 14. For example, the effective paramagnetic magnetic permeability at the Curie temperature 14 may be about $4\pi \times 10^{-7}$ henry per meter (H/m), as illustrated. In some examples (e.g., as illustrated), the temperature-dependent magnetic permeability 10 may increase (e.g., have a positive slope) as a function of temperature below the temperature of the Hopkinson peak 12.

FIG. 1 also illustrates a curve representing a first derivative 20 of magnetic permeability with respect to temperature. The magnetic permeability derivative 20 typically includes a maximum value at a temperature below the temperature of the Hopkinson peak 12 and a minimum value between the temperature of the Hopkinson peak 12 and the Curie temperature 14 of the ferromagnetic material. In some examples, the maximum value of the magnetic permeability derivative 20 may be slightly positive due to the positive slope of the temperature-dependent magnetic permeability 10 at a temperature below the temperature of the Hopkinson peak 12. The magnetic permeability derivative 20 typically becomes substantially zero at temperatures above the Curie temperature 14, as illustrated in FIG. 1.

As used herein, the article 'a' is intended to have its ordinary meaning in the patent arts, namely 'one or more'. For example, 'a coil' means one or more coils and as such, 'the coil' means 'the coil(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 20%, or plus or minus 10%, or plus or minus 5%, or plus or minus 1%, unless otherwise expressly specified. Moreover, examples herein are intended to be illustrative only and are presented for discussion purposes and not by way of limitation.

Figure 2:
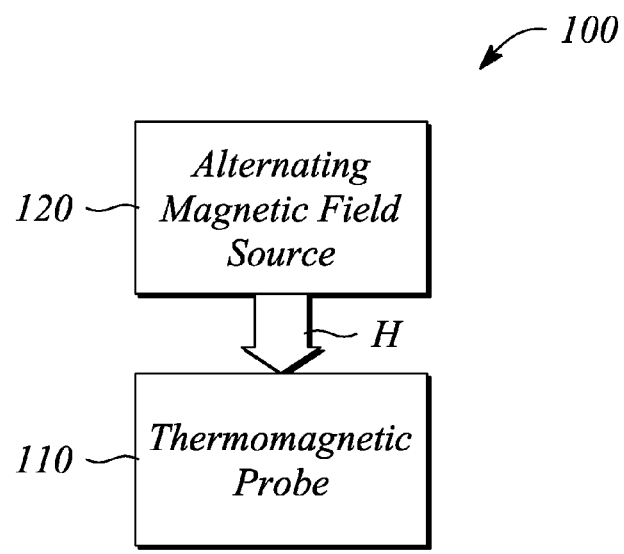
FIG. 2 illustrates a block diagram of a thermomagnetic sensor, according to an embodiment consistent with the principles of the present invention.

FIG. 2 illustrates a block diagram of a thermomagnetic sensor 100, according to an embodiment consistent with the principles of the present invention. According to various examples, the thermomagnetic sensor 100 employs a thermomagnetic effect to measure or determine temperature. The measured temperature is a temperature of an environment local to the thermomagnetic sensor 100 (e.g., an internal temperature of a device), according to various embodiments. According to some embodiments, the measured temperature is within a predefined range of temperature values. However, while specific examples of the thermomagnetic sensor 100 may exhibit a predefined range of temperatures that may be measured, the predefined temperature value range may be adjusted or tailored to facilitate measurement of a wide variety of temperature ranges, according to various embodiments.

As illustrated in FIG. 2, the thermomagnetic sensor 100 comprises a thermomagnetic probe 110. According to various examples, the thermomagnetic probe 110 comprises a ferromagnetic material having a temperature-dependent magnetic property. In particular, the ferromagnetic material may be substantially any ferromagnetic material having a temperature-dependent magnetic permeability characterized by a maximum magnetic permeability (i.e., the Hopkinson peak) at a temperature below the Curie point or temperature of the ferromagnetic material. Further, the ferromagnetic material of the thermomagnetic probe 110 has or exhibits a monotonically decreasing magnetic permeability as a function of temperature between the temperature with the maximum magnetic permeability value and the Curie temperature, according to various embodiments. The monotonically decreasing magnetic permeability as a function of temperature is referred to as a 'monotonic temperature-dependent magnetic permeability transition.' According to various embodiments, the monotonic temperature-dependent magnetic permeability is substantially similar (e.g., follows a substantially similar path) regardless of whether the ferromagnetic material is being heated or cooled. Further, the ferromagnetic material of the thermomagnetic probe 110 explicitly includes both ferromagnetic materials in which substantially all constituent magnetic domains add a positive contribution to a net magnetization as well as materials often referred to as 'ferrimagnetic' materials in which some of the magnetic domains may be anti-aligned, by definition herein.

In some embodiments, the ferromagnetic material of the thermomagnetic probe 110 comprises nickel (e.g., as a 'pure' metal, an alloy, a compound or a mixture). For example, ferromagnetic material may be a nickel alloy that comprises nickel (Ni) and one or more of iron (Fe), copper (Cu), aluminum (Al), chromium (Cr), gold (Au), palladium (Pd), zinc (Zn) and silicon (Si). A Ni—Cu alloy having about 70% Ni and 30% Cu may be employed as the ferromagnetic material of the thermomagnetic probe 110, for example. Other ferromagnetic materials that may be employed include, but are not limited alloys, compounds or mixtures comprising one or more of cobalt (Co), Fe, gadolinium (Gd) and dsyprosium (Dy), as well as manganese (Mn) and chromium (Cr), which may produce ferromagnetic crystals in combination with other atoms such as bismuth (Bi), arsenic (As) and antimony (Sb) (e.g., MnBi, MnAs, MnSb). Various oxides and compounds including oxygen (O) that exhibit ferromagnetic characteristics including, but not limited to, $Fe_2O_3$, $FeOFe_2O_3$, $NiOFe_2O_3$, $CuOFe_2O_3$, etc., may also be employed as the ferromagnetic material of the thermomagnetic probe 110. Even if not explicitly listed herein, substantially any material that exhibits ferromagnetism having both of the Hopkinson peak and the Curie temperature, as well as the monotonic change in the temperature-dependent magnetic permeability between the Hopkinson peak and the Curie temperature, may be used to realize the thermomagnetic probe 110, according to various embodiments.

Figure 3:
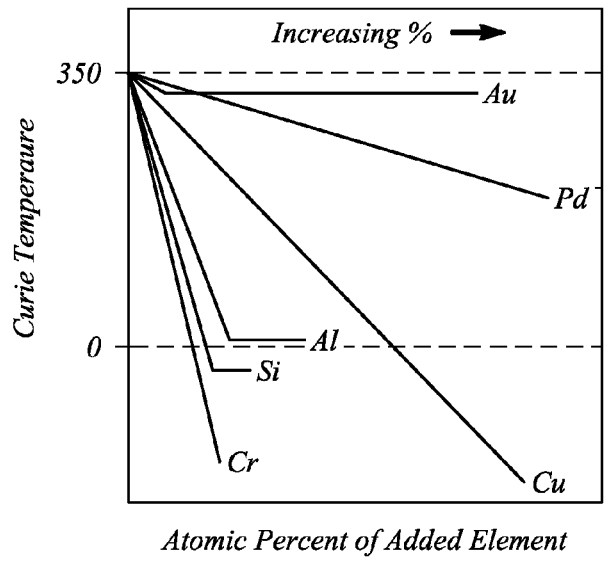
FIG. 3 illustrates a graph depicting a Curie temperature adjustment, according to an embodiment consistent with the principles of the present invention.

According to some embodiments according to the principles of the present invention, one or both of the Curie temperature and a slope of the temperature-dependent magnetic permeability may be adjusted or tailored to a specific application of the thermomagnetic sensor 100. For example, the Curie temperature of various example nickel alloys may be adjusted by changing a relative percentage composition of Ni and another constituent of the alloy. FIG. 3 illustrates a graph depicting a Curie temperature adjustment, according to an embodiment consistent with the principles of the present invention. In particular, FIG. 3 illustrates a variation of the Curie temperature for various nickel alloys as a function of atomic percent of elements added to the nickel. FIG. 3 is based on FIG. 14-11, page 721 of Bozorth, R., Ferromagnetism, D. Van Nostrand Company, 1951. In another example, fabrication conditions such as, but not limited to, sintering temperature instead of or in addition to composition may be used to control or adjust one or both of the Curie temperature and the temperature-dependent magnetic permeability slope. See for example, Brito et al., "Evaluation of a Ni—Zn Ferrite for use in Temperature Sensors," Progress in Electromagnetic Research Letters, Vol. 13, 2010, pp. 103-112.

According to various embodiments, the ferromagnetic material may be formed into substantially any shape or configuration as may be suitable for realizing the thermomagnetic probe 110. For example, the ferromagnetic material may be formed into a rod or wire shape. The rod or wire shape may facilitate insertion into a device for which temperature is to be measured using the thermomagnetic sensor 100, for example. In another example, the thermomagnetic probe 110 may be formed into a spheroidal shape or an ellipsoidal shape (e.g., a sphere, an egg-shape, etc.). In yet another example, the ferromagnetic material of the thermomagnetic probe 110 may be deposited as a layer or a film on a substrate. The layer may be a thin film on a surface of another, non-ferromagnetic metal, for example. The thermomagnetic probe 110 may even be realized as a plurality of particles (e.g., nanoparticles). The particle form of the thermomagnetic probe 110 may facilitate monitoring or measuring temperature in a local region over which the particles are distributed, for example.

Referring again to FIG. 2, the thermomagnetic sensor 100 further comprises an alternating magnetic field source 120. The alternating magnetic field source 120 is configured to produce an alternating (e.g., sinusoidal wave, square wave, etc.) magnetic field H in a vicinity of the thermomagnetic probe 110. The alternating magnetic field H facilitates measuring the temperature-dependent magnetic permeability as a function of temperature.

According to various embodiments, the alternating magnetic field H has a predetermined maximum frequency and a predetermined minimum frequency. The predetermined maximum frequency of the alternating magnetic field H may be established by a limited ability of the alternating magnetic field H to penetrate to, and thus affect, the thermomagnetic probe 110, for example. The predetermined minimum frequency may be established to insure that the temperature-dependent magnetic permeability of the thermomagnetic probe 110 can be measured. In particular, in some embodiments, the alternating magnetic field H may have a predetermined maximum frequency of less than about 10 kilohertz (kHz). In some examples, the predetermined maximum frequency may be less than about 1 kHz. In some examples, the predetermined maximum frequency is less than about 500 hertz (Hz). In some examples, the alternating magnetic field H has a predetermined minimum frequency that is greater than about 10 Hz and a predetermined maximum frequency that is less than about 10 kilohertz. For example, the frequency of the alternating magnetic field H may be between about 100 Hz (e.g., the predetermined minimum frequency) and 200 Hz (e.g., the predetermined maximum frequency). In another example, the frequency may be between about 110 Hz and 750 Hz. In another example, the frequency may be about 120-130 Hz.

According to various embodiments, a predetermined relationship between the temperature-dependent magnetic permeability and temperature provides a measurement of a temperature local to the thermomagnetic probe. In some embodiments, the predetermined relationship is described or defined in a range between the maximum value (Hopkinson peak) and the Curie temperature of the ferromagnetic material. The predetermined relationship may be provided by a calibration curve for the thermomagnetic sensor 100, for example. The calibration curve may be provided by subjecting the thermomagnetic probe to a plurality of temperatures and measuring one or both of the magnetic permeability and a change in the magnetic permeability as a function of temperature, for example. As such, the calibration curve may define the predetermined relationship in terms of one or both of the temperature-dependent magnetic permeability itself and a temperature derivative of the magnetic permeability.

According to some embodiments according to the principles of the present invention, the alternating magnetic field source 120 of the thermomagnetic sensor 100 comprises an alternating magnetic field source coil. The alternating magnetic field source coil is spaced apart from the thermomagnetic probe 110, according to various embodiments. For example, an alternating current (AC) flowing in the alternating magnetic field source coil produces an alternating magnetic field H around the alternating magnetic field source coil. The alternating magnetic field H extends from the alternating magnetic field source coil to the thermomagnetic probe 110 of the thermomagnetic sensor 100 to facilitate measurement of the temperature-dependent magnetic permeability, for example.

In various embodiments, the alternating magnetic field source 120 may further comprise one or both of an AC current source and an AC voltage source. In some embodiments, the alternating field source 120 may further comprise one of an inductance meter and an impedance meter that includes one or both of the AC current source and the AC voltage source. For example, the inductance meter may be an inductance-capacitance-impedance (LCZ) meter such as, but not limited to, a Keithley 3330 LCZ meter manufactured by Keithley Instruments, Inc., of Cleveland, Ohio. In some embodiments, such as when the alternating magnetic field source 120 includes an LCZ meter, the measurement of the temperature-dependent magnetic permeability may be provided by or derived from a measurement of an inductance of the alternating magnetic field source coil.

For example, the self-inductance of the alternating magnetic field source coil may be used to determine or derive one or both of the temperature-dependent magnetic permeability and the change in the temperature-dependent magnetic permeability. The alternating magnetic field source coil may be a toroidal coil that either partially or completely surrounds the thermomagnetic probe 110, for example. In other examples, the thermomagnetic probe 110 may be located adjacent to an end of a toroidal coil to intercept the alternating magnetic field H extending from the end. In other examples, the alternating magnetic field source coil may be another coil configuration including, but not limited to a planar coil. For example, the planar coil may be positioned adjacent to and above the thermomagnetic probe 110.

Figure 4A:
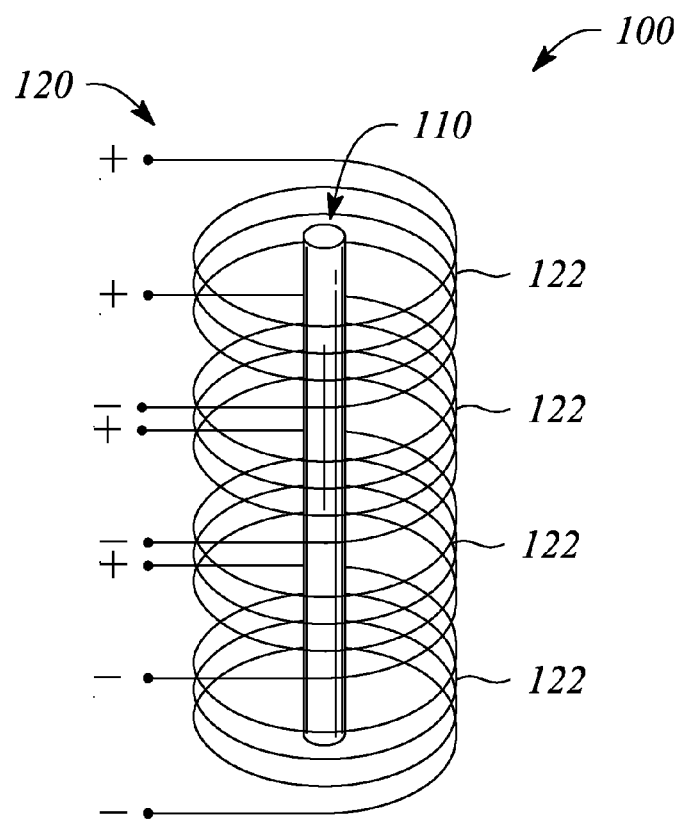
FIG. 4A illustrates a perspective view of an alternating magnetic field source coil of an alternating magnetic field source, according to an embodiment consistent with the principles of the present invention.
Figure 4B:
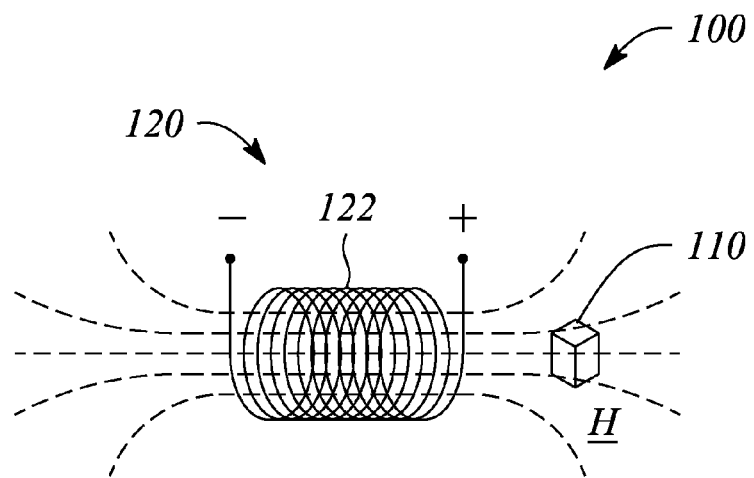
FIG. 4B illustrates a perspective view of a toroidal coil with a thermomagnetic probe positioned at an end of the toroidal coil, according to an embodiment consistent with the principles of the present invention.

FIG. 4A illustrates a perspective view of an alternating magnetic field source coil 122 of the alternating magnetic field source 120 of the thermomagnetic sensor 100, according to an embodiment consistent with the principles of the present invention. As illustrated, the alternating magnetic field source coil 122 is configured as a toroidal coil 122 that surrounds the thermomagnetic probe 110. The toroidal coil 122 may be positioned or wound around a cylinder that encloses the thermomagnetic probe 110, for example. In some embodiments, the toroidal coil 122 may comprise between about ten and about forty (e.g., about 33) turns or loops of wire wound around the cylindrical form, for example. FIG. 4B illustrates a perspective view a toroidal coil 122 with the thermomagnetic probe 110 positioned at an end of the toroidal coil 122, according to another embodiment consistent with the principles of the present invention. Dashed lines in FIG. 4B illustrate the alternating magnetic field H produced by and intercepting the thermomagnetic probe 110 by way of example and not limitation.

Figure 4C:
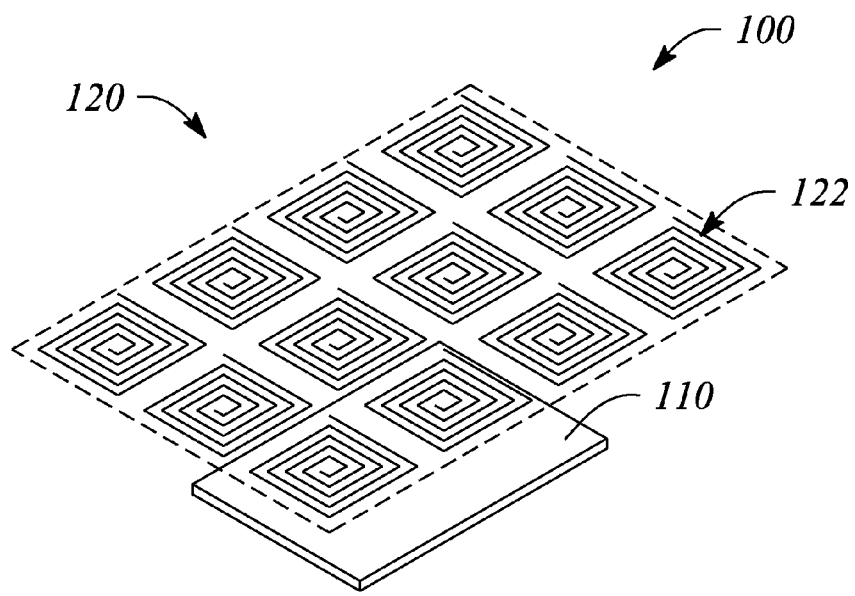
FIG. 4C illustrates a perspective view of another alternating magnetic field source coil of an alternating magnetic field source, according to an embodiment consistent with the principles of the present invention.

FIG. 4C illustrates a perspective view of another alternating magnetic field source coil 122 of the alternating magnetic field source 120 of the thermomagnetic sensor 100, according to an embodiment consistent with the principles of the present invention. In particular, the alternating magnetic field source coil 122 is a planar coil 122 that is located above the thermomagnetic probe 110, as illustrated in FIG. 4C, by way of example. The planar coil 122 illustrated in FIG. 4C is a square planar coil. Other coil configurations including, but not limited to, a circular planar coil (not illustrated) may also be used, according to some embodiments. Further, a variety of other coil configurations (not illustrated) may be employed as the alternating magnetic field source coil 122 provided that the alternating magnetic field H produced by the coil configuration intercepts and, in turn, is influenced by the thermomagnetic probe 110 to facilitate measurement of the temperature-dependent magnetic permeability.

In some embodiments, the thermomagnetic sensor 100 further comprises a sensing coil (not illustrated in FIG. 2). The sensing coil is spaced apart from the thermomagnetic probe 110. The sensing coil is configured to measure the temperature-dependent magnetic permeability as a function of a coupling between the sensing coil and the alternating magnetic field source 120. For example, the sensing coil may comprise another coil that is separate from the coil of the alternating magnetic field source 120. The coupling may be a coupling between the alternating magnetic field source coil and the sensing coil and may be characterized as a mutual inductance between coils, for example. The temperature-dependent magnetic permeability of the thermomagnetic probe 110 affects the coupling (e.g., by changing a strength of the coupling) to facilitate measurement of the temperature, according to some embodiments.

Figure 5:
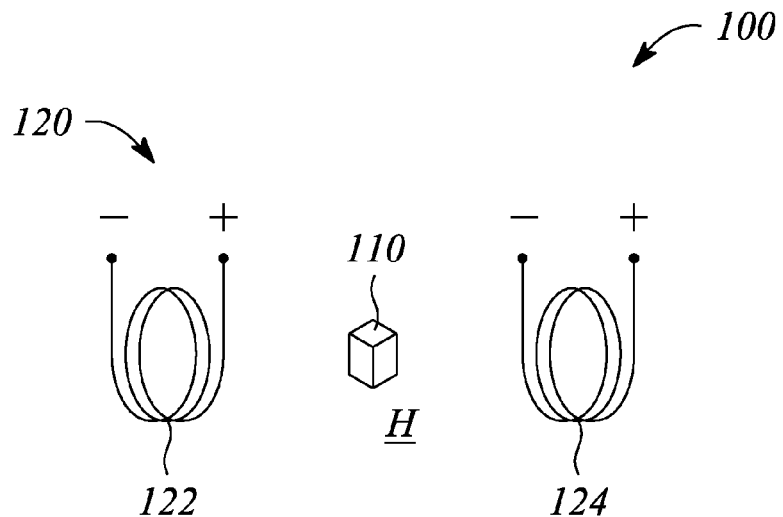
FIG. 5 illustrates a perspective view of a pair of coils positioned relative to a thermomagnetic probe, according to an embodiment consistent with the principles of the present invention.

FIG. 5 illustrates a perspective view of a pair of coils positioned relative to a thermomagnetic probe 110 of a thermomagnetic sensor 100, according to an embodiment consistent with the principles of the present invention. In particular, FIG. 5 illustrates the pair of coils as the alternating magnetic field source coil 122 and a sensing coil 124. As illustrated, the alternating magnetic field source coil 122 and the sensing coil 124 are positioned on opposite sides of the thermomagnetic probe 110. The temperature-dependent magnetic permeability of the thermomagnetic probe 110 modifies the coupling (e.g., through the alternating magnetic field H) between the sensing coil 124 and the alternating magnetic field source coil 122. The modification of the coupling facilitates measurement of the temperature-dependent magnetic permeability of the thermomagnetic probe 110. In other examples, the magnetic field source coil 122 and the sensing coil 124 are located other than on opposite sides of the thermomagnetic probe 110. For example (not illustrated), the alternating magnetic field source coil 122 and the sensing coil 124 may be collocated with one another as a bifilar coil. In another example (not illustrated), the pair of coils 122, 124 may be located adjacent to one another such that at least a portion of the alternating magnetic field H produced by the magnetic field source coil 122 and received by the sensing coil 124 passes through the thermomagnetic probe 110 to affect the coupling between the pair of coils 122, 124. A measurement of mutual inductance between the pair of coils 122, 124 may be used to provide the measurement of the temperature-dependent magnetic permeability, for example. For example, the temperature-dependent magnetic permeability may be derived or computed from the measured mutual inductance.

In some embodiments consistent with the principles of the present invention, the thermomagnetic sensor 100 comprises a plurality of coils configured to provide a thermal image of a device in which temperature is being measured. The coils of the plurality are spaced apart from one another and may be distributed one or both of along an axial length of and out-of-plane of the device, in various examples. The thermomagnetic probe may be located either adjacent to (e.g., in front of) or between pairs of coils of the plurality, for example. The thermal image may be constructed from a plurality of measurements of the temperature-dependent magnetic permeability of the thermomagnetic probe 110, according to some embodiments.

For example, in thermal image of a device, the alternating magnetic field source 120 may comprise one or more coils of the plurality of spaced apart coils. The thermal image may be constructed from a plurality of measurements of inductance of the different coils of the plurality. One or both of self inductance of individual ones of the spaced apart coils and mutual inductance between pairs of the spaced apart coils may be measured, for example. Referring again to FIG. 4A, the alternating magnetic field source 120 may comprise a plurality of alternating magnetic field source coils 122 (e.g., a plurality of toroidal coils 122, as illustrated) distributed along a length of a cylinder that contains the thermomagnetic probe 110. The distribution of toroidal coils 122 along the length of the cylinder, as illustrated in FIG. 4A, may facilitate performing a plurality of different temperature-dependent magnetic permeability measurements at different points along the length of the cylinder, for example. The different temperature-dependent magnetic permeability measurement, in turn, may be used to determine a temperature profile along the cylinder length, according to some embodiments.

In another example of thermal imaging of a device, one or more coils of the plurality of spaced apart coils may be sensing coils. The thermal image of the device accordingly may be constructed from a plurality of measurements of temperature-dependent magnetic permeability of the thermomagnetic probe derived from different combinations of coupling between the sensing coils and the alternating magnetic field source 120. For example, the coils may be arranged in an array that is one of around or adjacent to the thermomagnetic probe. Each of the sensing coils may facilitate performing a different temperature-dependent magnetic permeability measurement and by extension, a different temperature measurement. Each of the different measurements may be at a different location within the device, according to some embodiments. The different measurements at different locations may be combined to provide a thermal image of the device containing the thermomagnetic probe 110, for example.

In some embodiments, the plurality of coils may comprise a plurality of sensing coils and another plurality of alternating magnetic field source coils. For example, the plurality of sensing coils may be located on one side of a device and the plurality of alternating magnetic field source coils may be located on another side of the device. The coils may be arranged in an array (e.g., a circular array) that encloses or surrounds the thermomagnetic probe, for example. Measurements between the plurality of sensing coils and the other plurality of magnetic field source coils may be combined to provide the thermal image of the device, according to some embodiments.

In some embodiments, the thermomagnetic probe 110 may comprise a plurality of separate, spaced-apart sub-probes. Each sub-probe may exhibit a temperature-dependent magnetic permeability associated with a local temperature in a vicinity of the sub-probe. The sub-probes may be distributed within the device, for example. Different measurements of the temperature-dependent magnetic permeability of the various sub-probes may be combined to produce a multi-dimensional thermal image of a temperature within a device, according to some embodiments. For example, a plurality of alternating magnetic field source coils may be positioned to separately measure the temperature-dependent magnetic permeability of different ones of the various sub-probes. The temperature-dependent magnetic permeability of the different sub-probes may be measured using an inductance measurement, for example.

In some embodiments, the alternating magnetic field source 120 is configured to produce a plurality of frequencies. A first frequency of the plurality of frequencies may be configured to facilitate measurement of the temperature-dependent magnetic permeability of the thermomagnetic probe 110, for example. According to some embodiments, a second frequency of the plurality is configured to measure an eddy current induced by the alternating magnetic field H in a conductor that is spaced apart from the thermomagnetic probe. For example, the conductor may be shell or housing of a device being measured. In particular, the eddy current may be induced by the alternating magnetic field H in a conductor between the alternating magnetic field source and the thermomagnetic probe, according to some embodiments.

In some embodiments, the second frequency is higher than about 1 kHz while the first frequency may be less than 10 kHz. For example, the second frequency may be between about 1 kHz and about 50 kHz. In another example, the second frequency may be about 10-20 kHz. The measurement of eddy current, or more specifically of an effect of the eddy current, may be performed by a measurement of inductance of an alternating magnetic field source coil, for example.

In some embodiments, the eddy current may interfere with or distort the measurement of the temperature-dependent magnetic permeability. Measurement of the eddy current may allow for mitigating the interfering effect of the eddy current on the measurement of the temperature-dependent magnetic permeability, for example. In some embodiments, measurement of the eddy current may facilitate measurement of a temperature in a vicinity of the conductor. For example, the temperature in the vicinity of the conductor may be measured using a temperature-dependent resistance of the conductor.

Figure 6:
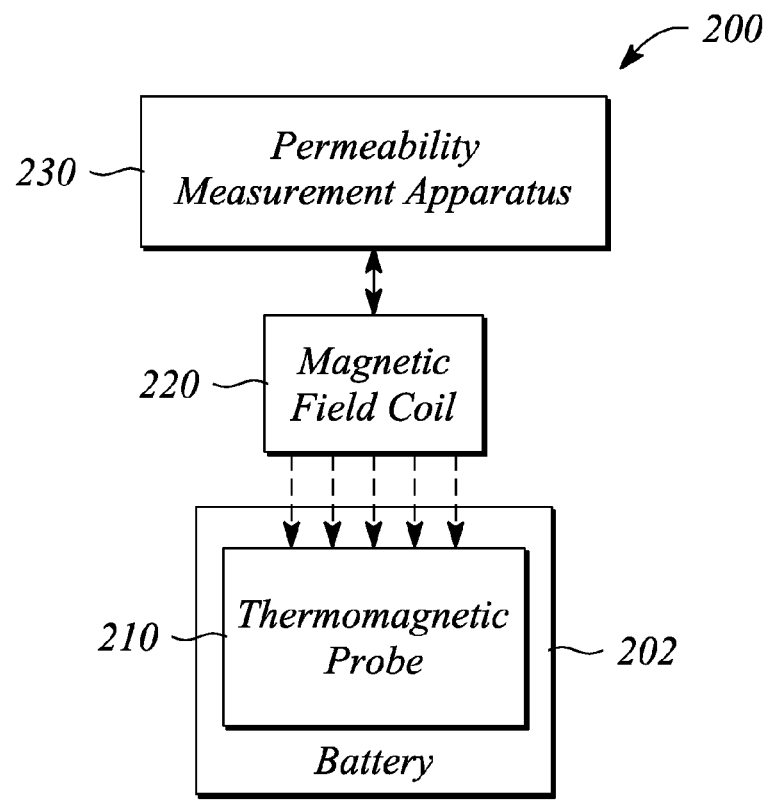
FIG. 6 illustrates a block diagram of a battery-temperature measurement system, according to an embodiment consistent with the principles of the present invention.

FIG. 6 illustrates a block diagram of a battery-temperature measurement system 200, according to an embodiment consistent with the principles of the present invention. According to various embodiments, the battery-temperature measurement system 200 is configured to measure an internal temperature of a battery 202. The battery-temperature measurement system 200 is not limited to a particular battery 202 or battery configuration, according to various embodiments. For example, the battery 202 may have a cylindrical, a prismatic, or another configuration. Further, the battery 202 may employ virtually any battery technology (e.g., either rechargeable or non-rechargeable) including, but is not limited to, nickel-cadmium (NiCd) batteries, nickel-metal hydride (NiMH) batteries, and various types of lithium-ion batteries. The internal temperature of the battery 202 may be measured by the battery-temperature measurement system 200 remotely, according to some embodiments. In some embodiments, the measured internal temperature provides a thermal image of temperature within the battery 202. While identified as a 'battery-temperature' measurement system, in some embodiments, the battery-temperature measurement system 200 may be used to measure a temperature of another device instead of the battery 202, for example, a supercapacitor. The battery-temperature measurement system 200 may even be used to measure a temperature of an environment (e.g., other than a device) that is local to the battery-temperature measurement system 200, according to some embodiments.

As illustrated in FIG. 6, the battery-temperature measurement system 200 comprises a thermomagnetic probe 210 in the battery 202 (or other device, for example). For example, the thermomagnetic probe 210 may be located in a core of the battery 202 to measure an internal temperature of the battery 202. The thermomagnetic probe 210 may be incorporated in or be part of a current collector of the battery 202 (e.g., as a thin film coating on the current collector), for example. According to various embodiments, the thermomagnetic probe 210 may be substantially similar to the thermomagnetic probe 110 described above with respect to the thermomagnetic sensor 100. In particular, the thermomagnetic probe 210 may comprise a ferromagnetic material having a temperature-dependent magnetic permeability characterized by a maximum magnetic permeability value (e.g., a Hopkinson peak) at a temperature below a Curie temperature or temperature of the ferromagnetic material. The temperature-dependent magnetic permeability has a monotonically decreasing value as a function of temperature between the maximum value and the Curie temperature, according to various embodiments.

The battery-temperature measurement system 200 further comprises a magnetic field coil 220. The magnetic field coil 220 is located external to the battery 202 and therefore spaced apart from the thermomagnetic probe 210. According to various embodiments, the magnetic field coil 220 is configured to apply an alternating magnetic field H to the thermomagnetic probe 210. According to some embodiments, the alternating magnetic field H may be substantially similar to the alternating magnetic field H produced by the alternating magnetic field source 120 of the thermomagnetic sensor 100, described above. In addition, the magnetic field coil 220 may be substantially similar to the alternating magnetic field source coil 122 described above, in some embodiments. For example, the magnetic field coil 220 may be implemented as a toroidal coil 122 around a cylindrical-shaped battery 202.

According to various embodiments, the battery-temperature measurement system 200 further comprises a magnetic permeability measurement apparatus 230. The magnetic permeability measurement apparatus 230 is configured to measure the temperature-dependent magnetic permeability of the thermomagnetic probe 210, according to various embodiments. In some embodiments, the magnetic permeability measurement apparatus 230 comprises an inductance meter configured to measure an inductance of the magnetic field coil 220. In other examples, the magnetic permeability measurement apparatus 230 may comprise another measurement apparatus including, but not limited to, a coupling measurement apparatus configured to measure a coupling between the magnetic field coil 220 and another coil. The coupling measurement is then used to determine the temperature-dependent magnetic permeability. In some embodiments, the magnetic permeability measurement apparatus 230 measures a derivative of the temperature-dependent magnetic permeability instead of or in addition to the temperature-dependent magnetic permeability itself. The derivative may be a derivative with respect to temperature (e.g., a slope of a change in the temperature-dependent magnetic permeability), for example.

Figure 7:
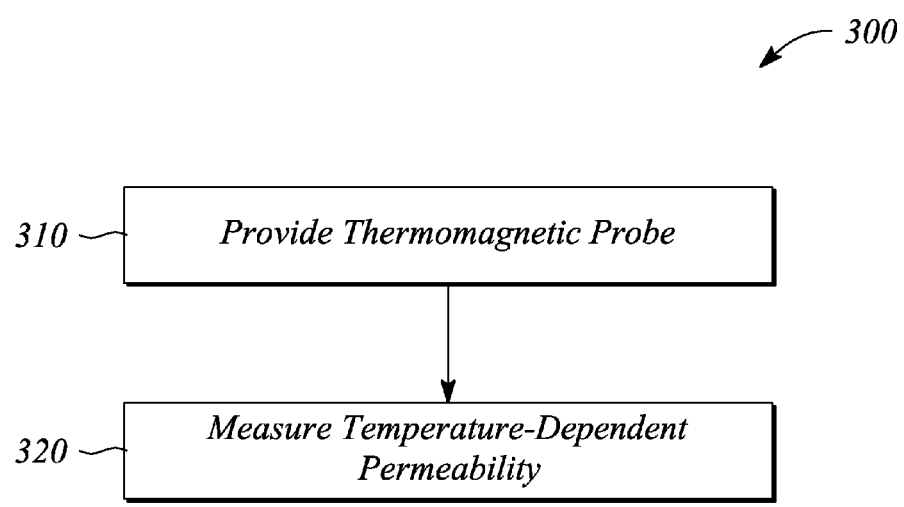
FIG. 7 illustrates a flow chart of a method of measuring temperature remotely using a thermomagnetic effect, according to an embodiment consistent with the principles of the present invention.

FIG. 7 illustrates a flow chart of a method 300 of measuring temperature remotely using a thermomagnetic effect, according to an embodiment consistent with the principles of the present invention. In particular, the method 300 of measuring temperature employs a temperature-dependent magnetic permeability to remotely measure temperature, according to various embodiments. The temperature-dependent magnetic permeability may be provided by a ferromagnetic material of a thermomagnetic probe, for example. The remotely measured temperature is measured without physical contact with the thermomagnetic probe and represents a temperature local to the thermomagnetic probe, according to various embodiments.

As illustrated in FIG. 7, the method 300 of remotely measuring temperature comprises providing 310 the thermomagnetic probe. The thermomagnetic probe comprises a ferromagnetic material having a temperature-dependent magnetic permeability characterized by a maximum magnetic permeability value (e.g., at the Hopkinson peak) at a temperature below a Curie temperature or temperature of the ferromagnetic material, according to various embodiments. Further, the temperature-dependent magnetic permeability of the ferromagnetic material exhibits a monotonically decreasing permeability value as a function of temperature between the maximum value and the Curie temperature. In some embodiments, the provided 310 thermomagnetic probe is substantially similar to the thermomagnetic probe 110 described above with respect to the thermomagnetic sensor 100.

As illustrated in FIG. 7, the method 300 of remotely measuring temperature further comprises measuring 320 the temperature-dependent magnetic permeability using an alternating magnetic field. Measuring 320 the temperature-dependent magnetic permeability is used to determine a temperature local to the thermomagnetic probe. The local temperature is determined according to a predetermined relationship between temperature and the temperature-dependent magnetic permeability in a temperature range between the maximum magnetic permeability value and the Curie temperature of the ferromagnetic material of the thermomagnetic probe, according to various embodiments. In some examples, the alternating magnetic field has a frequency of less than about 10 kHz and greater than about 10 Hz. In some examples, the alternating magnetic field is substantially similar to the alternating magnetic field provided by the alternating magnetic field source 120 of the thermomagnetic sensor 100, described above.

In some embodiments, the provided 310 thermomagnetic probe may comprise nickel and may be realized or configured as one or more of a rod, a wire, a particle and a film (e.g., a thin film). In some embodiments, the provided 310 thermomagnetic probe may comprise a plurality of separate, spaced-apart sub-probes, each sub-probe producing a temperature-dependent magnetic permeability associated with a local temperature in a vicinity of the sub-probe. In some embodiments, a plurality of different measurements of the temperature-dependent magnetic permeability of the sub-probes in combination provides a multi-dimensional thermal image of the local temperature.

In some embodiments, measuring 320 the temperature-dependent magnetic permeability comprises measuring an inductance of a coil adjacent to and spaced apart from the thermomagnetic probe. The coil may be substantially similar to the alternating magnetic field coil 122 described above with respect to the thermomagnetic sensor 100, for example. In some embodiments, measuring 320 the temperature-dependent magnetic permeability comprises measuring a coupling between a pair of coils such as, but not limited to, an alternating magnetic field source coil (e.g., coil 122) and a sensing coil (e.g., sensing coil 124). In some embodiments, the coils of the pair are coils of a plurality of coils distributed one or both of along an axial length of and out-of-plane of a device in which temperature is measured. In these examples, the thermomagnetic probe may be located inside the device, for example. Measuring 320 the temperature-dependent magnetic permeability for pairs of coils, or alternatively for single coils (e.g., using inductance), of the plurality of coils may facilitate forming a thermal image of the device, according to some embodiments.

In some embodiments, the method 300 of remotely measuring temperature further comprises measuring an effect of an eddy current on a conductor that is spaced apart from the thermomagnetic probe. In some embodiments, the conductor may be located between the thermomagnetic probe and a source of the alternating magnetic field. For example, the conductor may be a housing or shell of a battery containing the thermomagnetic probe. The eddy current may be induced in the conductor (e.g., the battery housing) by the alternating magnetic field. The effect may be a change (e.g., a reduction) in the measured 320 temperature-dependent magnetic permeability, according to some embodiments. In other examples, the effect of the eddy current may represent a temperature in a vicinity of the conductor (e.g., due to a thermo-resistive effect in the conductor). For example, the effect may be measured using a frequency of the alternating magnetic field that differs from the frequency used to measure the temperature-dependent magnetic permeability. The different frequency may be above 1 kHz, (e.g., between 1-50 kHz) allowing the effect of the eddy current to be distinguished from parameters associated with the temperature-dependent magnetic permeability which are generally more pronounced at lower frequencies.

Thus, there have been described examples of a thermomagnetic sensor, a battery-temperature measurement system and a method of measuring temperature remotely that employ a thermomagnetic effect of a ferromagnetic material. It should be understood that the above-described examples are merely illustrative of some of the many specific examples that represent principles consistent with the principles described herein. Clearly, those skilled in the art can readily devise numerous other arrangements without departing from the scope consistent with the principles described herein as defined by the following claims.

What is claimed is:

1. A thermomagnetic sensor comprising:
   a thermomagnetic probe comprising a ferromagnetic material having a temperature-dependent magnetic permeability characterized by a maximum magnetic permeability value at a temperature below a Curie temperature of the ferromagnetic material, the temperature-dependent magnetic permeability monotonically decreasing as a function of temperature between the maximum magnetic permeability value and the Curie temperature;
   an alternating magnetic field source to produce an alternating magnetic field in a vicinity of the thermomagnetic probe to facilitate a measurement of the temperature-dependent magnetic permeability as a function of temperature, the alternating magnetic field having a frequency between about 10 hertz and about 10 kilohertz; and
   a sensing coil spaced apart from and operably connected to the thermomagnetic probe,
   wherein a predetermined relationship between the temperature-dependent magnetic permeability and temperature in a range between the maximum magnetic permeability value and the Curie temperature provides a measurement of a temperature local to the thermomagnetic probe.

2. The thermomagnetic sensor of claim 1, wherein the ferromagnetic material of the thermomagnetic probe comprises nickel, the ferromagnetic material being formed into one or more of a thin film, a plurality of particles, a spheroid, a wire and a rod.

3. The thermomagnetic sensor of claim 1, wherein the alternating magnetic field source comprises a field source coil spaced apart from and operably connected to the thermomagnetic probe, the field source coil being configured to provide the alternating magnetic field, a measurement of the temperature-dependent magnetic permeability being derived from a measurement of an inductance of the field source coil using an inductance meter.

4. The thermomagnetic sensor of claim 1, wherein the sensing coil is configured to facilitate measurement of the temperature-dependent magnetic permeability using an inductance of the sensing coil measured using an inductance meter.

5. The thermomagnetic sensor of claim 4, wherein the alternating magnetic field source comprises a coil, the temperature-dependent magnetic permeability being measured using a mutual inductance between the alternating magnetic field source coil and the sensing coil, the mutual inductance being determined using an inductance meter.

6. The thermomagnetic sensor of claim 1, wherein the thermomagnetic probe is in or adjacent to a device in which temperature is to be measured, the temperature local to the thermomagnetic probe being a temperature of the device, the alternating magnetic field source comprising a plurality of coils spaced apart from one another in a vicinity of the device and operably connected to provide a plurality of measurements of inductance of the different coils of the coil plurality using an inductance meter.

7. The thermomagnetic sensor of claim 1, further comprising a plurality of coils spaced apart from and operably connected to one another and arranged in a vicinity of the thermomagnetic probe that is in a device in which temperature is to be measured, the temperature local to the thermomagnetic probe being a temperature of the device.

8. The thermomagnetic sensor of claim 1, wherein the thermomagnetic probe comprises a plurality of separate, spaced-apart and operably connected sub-probes, each sub-probe exhibiting a temperature-dependent magnetic permeability associated with a local temperature in a vicinity of the sub-probe, and wherein different measurements in the vicinities of the sub-probes of the plurality are combined to produce a multi-dimensional thermal image of a temperature local to the thermomagnetic probe, wherein the thermomagnetic probe is within a device in which temperature is to be measured, the temperature local to the thermomagnetic probe being a temperature of the device.

9. The thermomagnetic sensor of claim 1, wherein the thermomagnetic probe is located in or adjacent to a device in which temperature is to be measured and is spaced apart from and operably connected to a conductor of the device, and wherein the alternating magnetic field source is configured to produce a plurality of frequencies, a first frequency of the plurality to facilitate measurement of the temperature-dependent magnetic permeability of the thermomagnetic probe, a second frequency of the plurality being higher than about 1 kilohertz.

10. A battery-temperature measurement system comprising the thermomagnetic sensor of claim 1, wherein the thermomagnetic probe is located inside a battery and the measurement of the local temperature provides a remote measurement of an internal temperature of the battery.

11. A battery-temperature measurement system comprising:
- a thermomagnetic probe in a battery, the thermomagnetic probe comprising a ferromagnetic material having a temperature-dependent magnetic permeability characterized by a maximum magnetic permeability value at a temperature below a Curie temperature of the ferromagnetic material, the temperature-dependent magnetic permeability having a monotonically decreasing value as a function of temperature between the maximum magnetic permeability value and the Curie temperature;
- a magnetic field coil external to the battery to apply an alternating magnetic field to the thermomagnetic probe; and
- a magnetic permeability measurement apparatus to measure the temperature-dependent magnetic permeability of the thermomagnetic probe, wherein the measured temperature-dependent magnetic permeability determines a temperature local to the thermomagnetic probe for a temperature range between the maximum magnetic permeability value and the Curie temperature of the ferromagnetic material of the thermomagnetic probe.

12. The battery-temperature measurement system of claim 11, wherein the magnetic permeability measurement apparatus comprises an inductance meter to measure an inductance of the magnetic field coil to determine the temperature-dependent magnetic permeability.

13. The battery-temperature measurement system of claim 11, further comprising a sensing coil that is separate from and operably connected to the magnetic field coil, the magnetic permeability measurement apparatus measuring the temperature-dependent magnetic permeability using a mutual inductance between the magnetic field coil and the sensing coil using an inductance meter.

14. The battery-temperature measurement system of claim 11, wherein the thermomagnetic probe comprises a plurality of separate, spaced-apart and operably connected sub-probes, each sub-probe producing a temperature-dependent magnetic permeability associated with a local temperature in a vicinity of the sub-probe, the temperature local to the thermomagnetic probe being a temperature of the battery, and wherein a plurality of different measurements of the temperature-dependent magnetic permeability of the sub-probes in combination provides a multi-dimensional thermal image of the local temperature of the thermomagnetic probe and the temperature of the battery.

15. The battery-temperature measurement system of claim 11, wherein the ferromagnetic material of the thermomagnetic probe comprises nickel, and wherein the alternating magnetic field has a frequency less than about 10 kilohertz.

16. The battery-temperature measurement system of claim 11, wherein the thermomagnetic probe is spaced apart from and operably connected to a conductor of the battery, and wherein the alternating magnetic field source is configured to produce a plurality of frequencies, a first frequency of the plurality to facilitate measurement of the temperature-dependent magnetic permeability of the thermomagnetic probe, a second frequency of the plurality being higher than the first frequency.

* * * * *